United States Patent
Ning

(10) Patent No.: US 11,983,416 B2
(45) Date of Patent: May 14, 2024

(54) BASE DIE, MEMORY SYSTEM, AND SEMICONDUCTOR STRUCTURE

(71) Applicant: CHANGXIN MEMORY TECHNOLOGIES, INC., Hefei (CN)

(72) Inventor: Shu-Liang Ning, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 7 days.

(21) Appl. No.: 17/661,924

(22) Filed: May 4, 2022

(65) Prior Publication Data

US 2023/0137700 A1    May 4, 2023

(30) Foreign Application Priority Data

Oct. 29, 2021    (CN) .......................... 202111275395.2

(51) Int. Cl.
*G06F 3/06*        (2006.01)

(52) U.S. Cl.
CPC .......... *G06F 3/0619* (2013.01); *G06F 3/0653* (2013.01); *G06F 3/0673* (2013.01)

(58) Field of Classification Search
None
See application file for complete search history.

(56) References Cited

U.S. PATENT DOCUMENTS

| | | | |
|---|---|---|---|
| 11,416,335 B2 | 8/2022 | Cho et al. | |
| 2016/0357462 A1* | 12/2016 | Nam | G06F 3/0613 |
| 2019/0272121 A1* | 9/2019 | Khan | G06F 3/0673 |
| 2019/0278511 A1* | 9/2019 | Lee | G11C 7/1066 |
| 2020/0241989 A1* | 7/2020 | Mun | G06F 12/0238 |

* cited by examiner

*Primary Examiner* — Yaima Rigol
*Assistant Examiner* — Alexander J Yoon
(74) *Attorney, Agent, or Firm* — Syncoda LLC; Feng Ma

(57) ABSTRACT

A base die is configured to receive first data and first encoded data in a writing phase, perform first error checking and correction processing, wherein the first encoded data is obtained by performing a first error correction code encoding processing on the first data, and transmit second data to a memory die in the writing phase, wherein the second data includes a first data after the first error checking and correction processing; the base die is further configured to receive the second data from the memory die in a reading phase, perform second error correction code encoding processing on the second data to generate second encoded data, and transmit third data in the reading phase, wherein the third data includes the second encoded data and the first data after the first error checking and correction processing.

14 Claims, 11 Drawing Sheets

BASE DIE, MEMORY SYSTEM, AND SEMICONDUCTOR STRUCTURE

CROSS-REFERENCE TO RELATED APPLICATION

This application claims priority to Chinese Patent Application No. 202111275395.2 filed on Oct. 29, 2021, the disclosure of which is hereby incorporated by reference in its entirety.

BACKGROUND

Semiconductor memories can be divided into non-volatile memories and volatile memories. A dynamic random access memory (DRAM), as a volatile memory, has the advantages of high storage density and high read/write speed, and is widely used in various electronic systems.

As the DRAM has an increasingly advanced process and higher storage density, data stored in the DRAM may have errors, which may seriously affect the performance of the DRAM. Therefore, the error checking and correction or error correction coding (ECC) technology is usually used in the DRAM to detect or correct errors of the stored data.

SUMMARY

Embodiments of the present disclosure relate to the technical field of semiconductors, and in particular, to a base die, a memory system, and a semiconductor structure.

According to some embodiments of the present disclosure, in an aspect of the embodiments of the present disclosure, a base die applied to a memory system is provided, wherein the base die is configured to receive first data and first encoded data in a writing phase, perform a first error checking and correction processing, wherein the first encoded data is obtained by performing a first error correction code encoding processing on the first data, and transmit second data to a memory die in the writing phase, wherein the second data includes a first data after the first error checking and correction processing; and the base die is further configured to receive the second data from the memory die in a reading phase, perform a second error correction code encoding processing on the second data to generate second encoded data, and transmit third data in the reading phase, wherein the third data includes the second encoded data and the first data after the first error checking and correction processing.

According to some embodiments of the present disclosure, in another aspect of the embodiments of the present disclosure, a memory system is provided, including a processor, a base die, and a memory die, wherein the processor is configured to perform a first error correction code encoding processing on first data in a writing phase to generate first encoded data, and transmit the first data and the first encoded data to the base die; the base die is configured to receive the first data and the first encoded data in the writing phase, perform a first error checking and correction processing, and transmit second data to the memory die in the writing phase, wherein the second data includes a first data after the first error checking and correction processing; the base die is further configured to receive the second data from the memory die in a reading phase, perform a second error correction code encoding processing on the second data to generate second encoded data, and transmit third data to the processor in the reading phase, wherein the third data includes the second encoded data and the first data after the first error checking and correction processing; the memory die is configured to receive the second data from the base die in the writing phase, store the second data, and transmit the second data to the base die in the reading phase; and the processor is further configured to receive the third data from the base die in the reading phase, and perform a third error checking and correction processing on the third data, to obtain a first data after the third error checking and correction processing.

According to some embodiments of the present disclosure, in further another aspect of the embodiments of the present disclosure, a semiconductor structure is further provided, including: a carrier substrate; and the memory system described above, wherein the processor and the base die are both located on a surface of the carrier substrate, and the memory die is located on a surface of the base die away from the carrier substrate.

BRIEF DESCRIPTION OF THE DRAWINGS

One or more embodiments are exemplified by corresponding drawings, and these exemplified descriptions do not constitute a limitation on the embodiments. Components with the same reference numerals in the drawings are denoted as similar components, and the drawings are not limited by scale unless otherwise specified.

DETAILED DESCRIPTION

Figure 1:
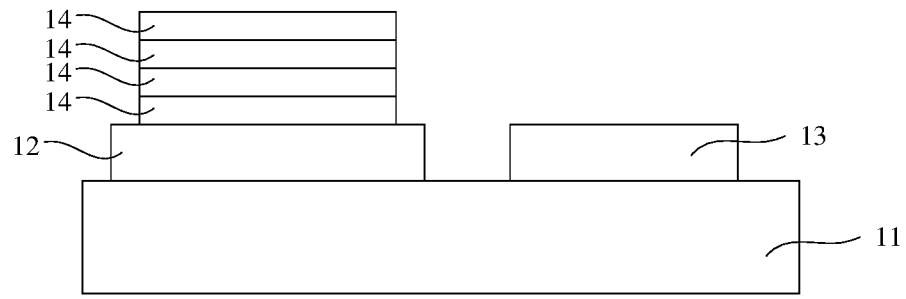
FIG. 1 is a schematic structural diagram of a semiconductor structure.
Figure 2:
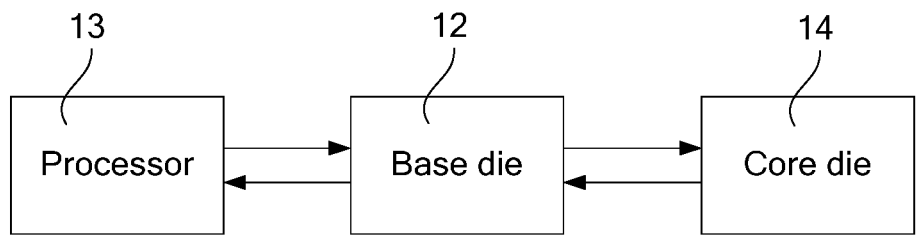
FIG. 2 is a schematic diagram of data transmission in the semiconductor structure provided in FIG. 1.

FIG. 1 is a schematic structural diagram of a semiconductor structure; FIG. 2 is a schematic diagram of data transmission in the semiconductor structure provided in FIG. 1.

Referring to FIG. 1, a semiconductor structure may include: a substrate 11; a base die 12 and a processor 13 that are located on a surface of the substrate 11; and a plurality of core dies 14 stacked on the base die 12, where the core dies 14 may be DRAM dies. Referring to FIG. 2, a data transmission process in the semiconductor structure includes: in a writing phase, the processor 13 transmits data to the base die 12, and the base die 12 transmits the data to the core die 14; before transmitting the data, the processor 13 may first perform error correction code (ECC) encoding processing on the data. In a reading phase, the core die 14 transmits data to the base die 12, and then the base die 12 transmits the data to the processor 13; the processor 13 receives the data and performs ECC decoding processing on the data, to detect and correct an error of the data.

Obviously, in the semiconductor structure, the base die 12 does not participate in the error checking and correction processing. That is, the base die 12 does not have an ECC encoding function and the corresponding error checking and correction function, and the error checking needs to be completed by the processor 13 or the core die 14. This makes the originally tight die areas of the processor 13 and the core die 14 even tighter, which affects the performance of the processor 13 and the core die 14. Therefore, the storage performance of the entire semiconductor structure still needs to be improved.

Figure 3:
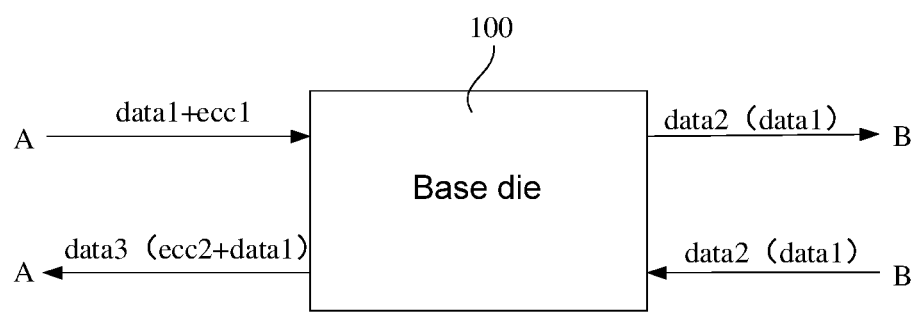
FIG. 3 is a first schematic structural diagram of a base die according to an embodiment of the present disclosure.
Figure 4:
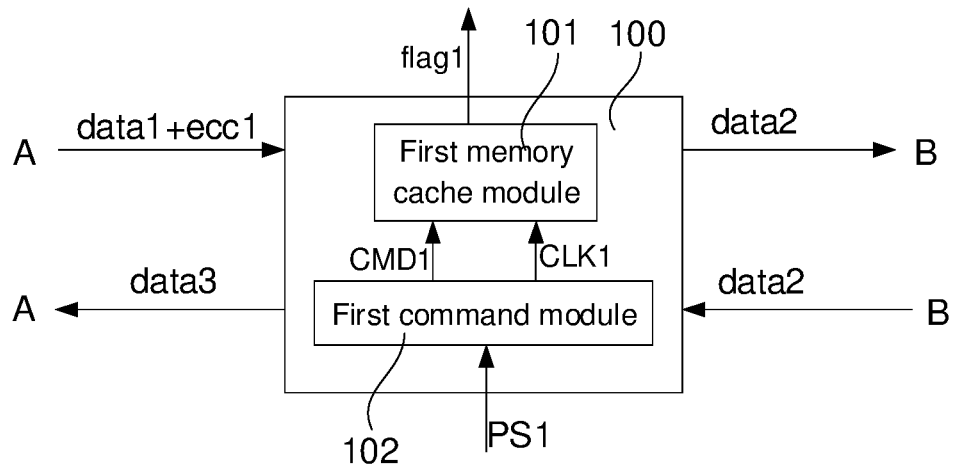
FIG. 4 is a second schematic structural diagram of a base die according to an embodiment of the present disclosure.
Figure 5:
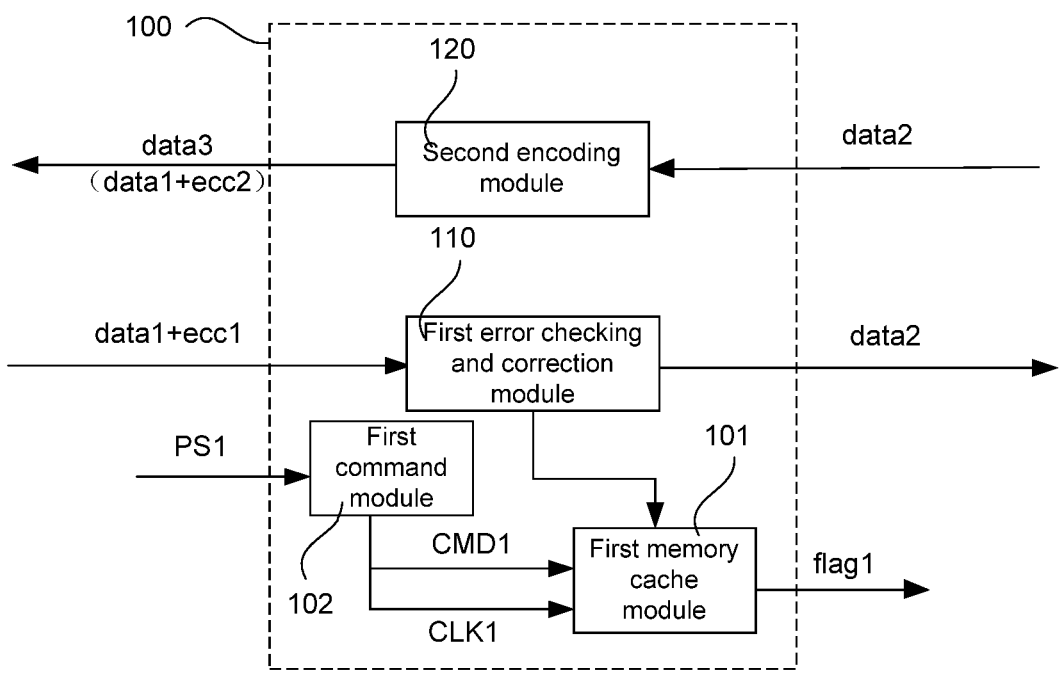
FIG. 5 is a third schematic structural diagram of a base die according to an embodiment of the present disclosure.
Figure 6:
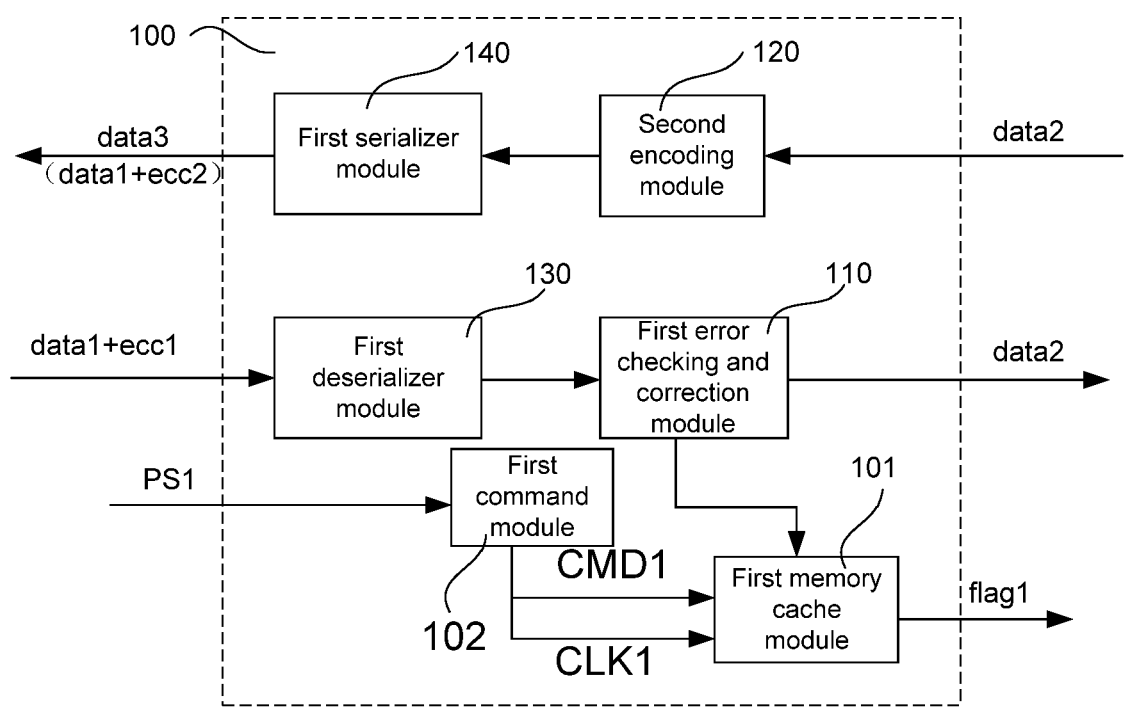
FIG. 6 is a fourth schematic structural diagram of a base die according to an embodiment of the present disclosure.
Figure 7:
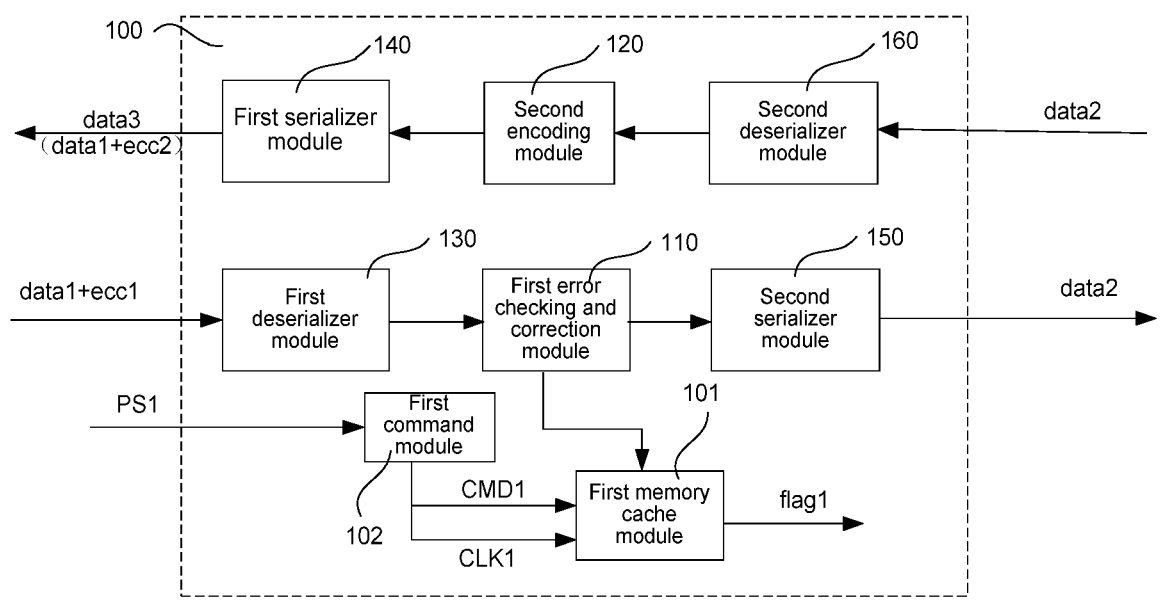
FIG. 7 is a fifth schematic structural diagram of a base die according to an embodiment of the present disclosure.
Figure 8:
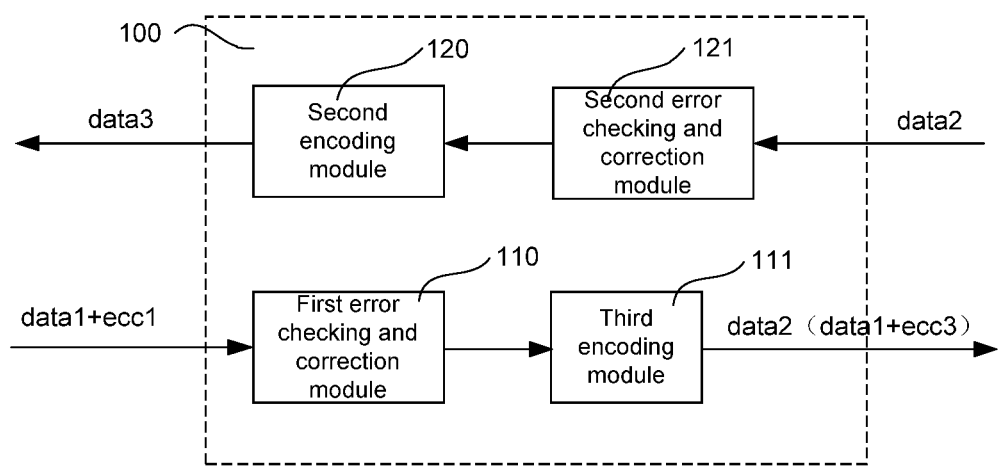
FIG. 8 is a sixth schematic structural diagram of a base die according to an embodiment of the present disclosure.
Figure 9:
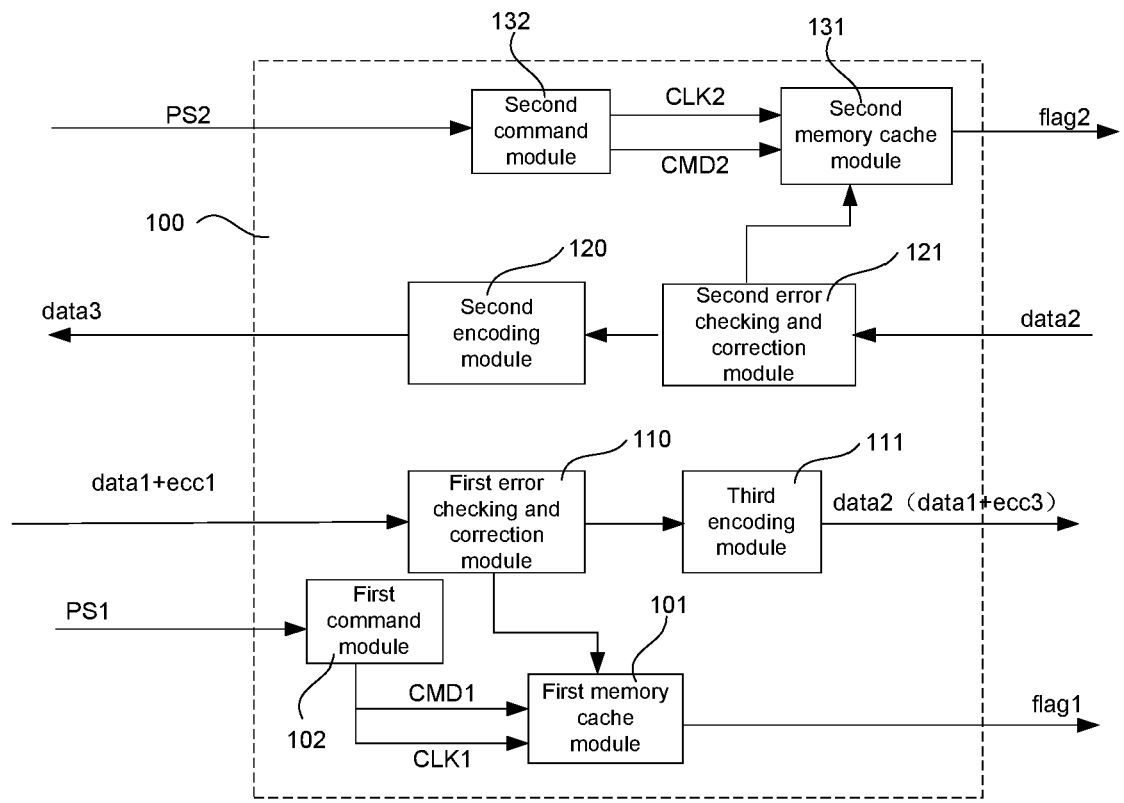
FIG. 9 is a seventh schematic structural diagram of a base die according to an embodiment of the present disclosure.

Embodiments of the present disclosure provide a base die, a memory system, and a semiconductor structure. The base die has an error checking and correction function. FIG. 3 is a first schematic structural diagram of a base die according to some embodiments of the present disclosure; FIG. 4 is a second schematic structural diagram of a base die according to some embodiments of the present disclosure; FIG. 5 is a third schematic structural diagram of a base die according to some embodiment of the present disclosure; FIG. 6 is a fourth schematic structural diagram of a base die according to some embodiments of the present disclosure; FIG. 7 is a fifth schematic structural diagram of a base die according to some embodiments of the present disclosure; FIG. 8 is a sixth schematic structural diagram of a base die according to some embodiments of the present disclosure; FIG. 9 is a seventh schematic structural diagram of a base die according to some embodiments of the present disclosure.

In order to make the objectives, technical solutions and advantages of the embodiments of the present disclosure clearer, the embodiments of the present disclosure are described below with reference to the accompanying drawings. Those of ordinary skill in the art should understand that many technical details are proposed in each embodiment of the present disclosure to help the reader better understand the present disclosure. However, even without these technical details and various changes and modifications made based on the following embodiments, the technical solutions claimed in the present disclosure may still be realized.

Referring to FIG. 3, a base die 100 is applied to a memory system. The base die 100 is configured to receive first data data1 and first encoded data ecc1 in a writing phase and perform first error checking and correction processing, where the first encoded data ecc1 is obtained by performing first ECC encoding processing on the first data data1, and transmit second data data2 to a memory die in the writing phase, where the second data data2 includes the first data data1 after the first error checking and correction processing. The base die 100 is further configured to receive the second data data2 from the memory die in a reading phase, perform second ECC encoding processing on the second data data2 to generate second encoded data ecc2, and transmit third data data3 in the reading phase, where the third data data3 includes the second encoded data ecc2 and the first data data1 after the first error checking and correction processing.

In the embodiments of the present disclosure, the base die 100 participates in the ECC encoding processing and the error checking and correction processing in the data transmission process.

In some embodiments, the base die 100 may be connected between a first port A and a second port B, where the first port A is connected to a data transmission port of a processor of the memory system, and the second port B is connected to a data transmission port of a memory die of the memory system. It may be understood that, the first port A and the second port B are general terms. The first port A includes a plurality of data transmission ports, and the second port B includes a plurality of data transmission ports. The number of data transmission ports is correlated to the number of pieces of data to be transmitted by the base die 100. For example, the number of data transmission ports is the same as the number of pieces of data to be transmitted by the base die 100, and one piece of data may be transmitted through one data transmission port.

The ECC encoding processing and the error checking and correction processing are both used for implementing ECC error checking and correction, to discover and locate an error of the first data during transmission and correct the error. In some embodiments, the ECC error checking and correction may adopt an error correction mechanism of Reed Solomon Code (RS); accordingly, the ECC encoding processing may adopt an RS encoding algorithm to generate encoded data, and decoding processing in the error checking and correction processing may adopt an RS decoding algorithm. In other embodiments, the ECC error checking and correction may adopt an error correction mechanism of Hamming code; accordingly, the ECC encoding processing may adopt a Hamming code encoding algorithm to generate encoded data, and decoding processing in the error checking and correction processing may adopt a Hamming code decoding algorithm.

In some embodiments, the first data data1 may be 256-bit data, and correspondingly, the first encoded data ecc1 may be 16-bit data. It may be understood that, in other embodiments, the first encoded data may include different numbers of bits depending on specific algorithms adopted in the ECC encoding processing. In addition, the first data data1 may include other numbers of bits, for example, 128 or 512.

In addition, in some embodiments, the base die 100 may be further configured to generate a first error checking flag signal during the error checking and correction processing, and record, based on the first error checking flag signal, an error of the first data data1 and the first encoded data ecc1 during transmission. Specifically, if the first data data1 or the first encoded data ecc1 has an error during transmission, the first error checking flag signal is generated; if the first data data1 and the first encoded data ecc1 has no error during transmission, no first error checking flag signal is generated. In addition, in some embodiments, the first error checking flag signal may be defined as follows: if the first data data1 or the first encoded data ecc1 has an error during transmission, the first error checking flag signal is 1; if the first data data1 and the first encoded data ecc1 have no error during transmission, the first error checking flag signal is 0. In other embodiments, the first error checking flag signal may also be defined as follows: if the first data data1 or the first encoded data ecc1 has an error during transmission, the first error checking flag signal is 0; if the first data data1 and the first encoded data ecc1 have no error during transmission, the first error checking flag signal is 1.

As shown in FIG. 4, in some embodiments, the base die 100 may further include: a first memory cache module 101, configured to the store an error of the first data data1 and the first encoded data ecc1 during transmission; and a first command module 102, configured to receive a first polling instruction PS1, and generate a first command signal CMD1 and a first clock signal CLK1. The first memory cache module is further configured to output a first representation signal flag1 based on the first command signal CMD1 and the first clock signal CLK1, where the first representation signal flag1 represents the error of the first data data1 and the first encoded data ecc1 during transmission.

It may be understood that, the error of the first data data1 and the first encoded data ecc1 during transmission refer to the error of the first data data1 and the first encoded data ecc1 during transmission from the processor to the base die 100.

In addition, if no first polling instruction PS1 is received, the first memory cache module 101 only stores the error of the first data data1 and the first encoded data ecc1 during transmission; after receiving the first polling instruction PS1, the first command module 102 controls the first memory cache module 101 to output the first representation signal flag1 that represents the error of the first data data1 or the first encoded data ecc1 during transmission. The error of the first data data1 and the first encoded data ecc1 can be obtained based on the first representation signal flag1.

In some embodiments, the first representation signal flag1 may be a binary string. For example, if an error of the first data data1 or the first encoded data ecc1 during transmission is detected, 1 is recorded; if no error of the first data data1 or the first encoded data ecc1 during transmission is detected, 0 is recorded. In this way, after a period of time, first representation signal flag1 is a binary string of 0 s and 1 s. In other embodiments, the first representation signal flag1 may alternatively be a decimal value. For example, the first memory cache module 101 is a counter, and if an error of the first data data1 during transmission is detected, the count is incremented by 1. In this way, after a period of time, the first representation signal flag1 is a decimal value related to the number of the error.

In some embodiments, the first memory cache module 101 may be a first input first output (FIFO) register. By using the FIFO register as the first memory cache module 101, a continuous data stream can be cached, to avoid data missing during a storage operation. In addition, the error of the first data data1 during transmission can be pushed and stored collectively, which can avoid frequent bus operations and help improve the data transmission speed.

In addition, in some embodiments, the first clock signal CLK1 may be generated by the first command module 102 independently; in other embodiments, the first clock signal CLK1 may alternatively be provided from the external, for example, provided by a processor that generates the first polling instruction PS1.

FIG. 5 is a third schematic structural diagram of a base die according to an embodiment of the present disclosure. Referring to FIG. 5, in some embodiments, the base die 100 may include: a first error checking and correction module 110, configured to receive the first data data1 and the first encoded data ecc1 in the writing phase, and perform the first error checking and correction processing; and a second encoding module 120, configured to receive, in the reading phase, the first data data1 after the first error checking and correction processing, and perform second ECC encoding processing to generate second encoded data ecc2.

Because the first error checking and correction module 110 and the second encoding module 120 are separate modules, which helps further improve the independence of the encoding operation and decoding operation, to avoid the data crosstalk. It should be noted that, the terms "first", "second" and "third" in the embodiments of the present disclosure are merely for descriptive distinction but are not intended to particularly limit the sequence of the corresponding features.

The first ECC encoding processing may adopt a Hamming code encoding operation or an RS encoding operation; accordingly, the first error checking and correction module 110 may adopt a Hamming code decoding operation or an RS decoding operation. The second encoding module 120 may adopt a Hamming code encoding operation or an RS encoding operation. In some embodiments, the first error checking and correction module 110 may receive the first data data1 and the first encoded data ecc1 from the processor, perform the first error checking and correction processing on the first data data1, and then transmit the second data data2 to the memory die, where the second data data2 is the first data data1 after the first error checking and correction processing. The second encoding module 120 may receive the second data data2 from the memory die, perform the second ECC encoding processing on the second data data2 to obtain the second encoded data ecc2, and transmit the first data data1 after the first error checking and correction processing and the second encoded data ecc2 to the processor, so that the processor continues to perform, by using the second encoded data ecc2, error checking and correction on the first data data1 after the first error checking and correction processing.

FIG. 6 is a fourth schematic structural diagram of a base die according to an embodiment of the present disclosure. Referring to FIG. 6, in some embodiments, in addition to the first error checking and correction module 110 and the second encoding module 120, the base die 100 may further include: a first deserializer (DES) module 130, configured to receive the first data data1 and the first encoded data ecc1 in the writing phase, perform first deserialization processing on the first data data1 and the first encoded data ecc1, and transmit the first data data1 after the first deserialization processing and the first encoded data ecc1 to the first error checking and correction module 110; and a first serializer (SER) module 140, configured to receive third data data3 from the second encoding module 120 in the reading phase, perform first serialization processing on the third data data3, and transmit the third data data3 after the first serialization processing to the processor.

The first deserializer module 130 and the first serializer module 140 can reduce the number of transmission channels between the base die 100 and the processor, and increase the number of bits transmitted on each transmission channel. In addition, as the number of transmission channels decreases, the number of data transmission ports required by the base die 100 and the processor can be reduced, to save the die area of the base die 100 and the die area of the processor. The first data data1 is transmitted to the first deserializer module 130 in a serial manner. The first deserializer module 130 is also known as a deserializer, which deserializes the first data data1 and the first encoded data ecc1. The first serializer module 140 performs serialization processing on the third data data3 and transmits the third data data3 after the serialization processing. The first serializer module 140 is also known as a serializer.

For example, the first data data1 includes 256 bits, and the first data data1 is transmitted to the first deserializer module 130 through 32 transmission channels. The first encoded data ecc1 includes 16 bits, and the first encoded data ecc1 is transmitted to the first deserializer module 130 through 2 transmission channels. After the first data data1 and the first encoded data ecc1 are deserialized by the first deserializer module 130, the first data data1 is transmitted to the first error checking and correction module 110 by using 256 transmission channels, and the first encoded data ecc1 is transmitted to the first error checking and correction module 110 through 16 transmission channels. The third data includes 256+16 bits, where 256 bits of the data are the first data after the first error checking and correction processing, and 16 bits of the data are the second encoded data ecc2. After the serialization processing by the first serializer module 140, the third data datat3 is converted into 32+2 streams of data. Correspondingly, the 32+2 streams of data may be transmitted through 32+2 transmission channels, where 32 streams of the data are the first data data1 after the first error checking and correction processing, and 2 streams of the data are the second encoded data ecc2.

FIG. 7 is a fifth schematic structural diagram of a base die according to an embodiment of the present disclosure. Referring to FIG. 7, in some embodiments, in addition to the first error checking and correction module 110, the second encoding module 120, the first deserializer module 130, and the first serializer module 140, the base die 100 may further include: a second serializer module 150, configured to receive the second data data2 in the writing phase, perform second serialization processing, and transmit the second data data2 after the second serialization processing to the memory die; and a second deserializer module 160, configured to receive the second data data2 from the memory die in the reading phase, perform second deserialization processing, and transmit the second data data2 after the second deserialization processing to the second encoding module 120.

The second serializer module 150 performs serialization processing on the second data data2, which helps reduce the number of transmission channels between the base die 100 and the memory die, so as to reduce the number of data transmission ports required by the base die 100 and the memory die, thereby saving the die area of the base die 100 and the die area of the memory die. For example, the second data data2 may include 256-bit first data data1 after the first error checking and correction processing, and after the second serializer module 150 performs the serialization processing, the second data data2 may be transmitted to the memory die through 128 transmission channels.

The second deserializer module 160 performs parallel processing on the second data data2 transmitted from the memory die, that is, performs deserialization processing on the second data data2, and the second data data2 after the deserialization processing is transmitted to the second encoding module 120. For example, the second deserializer module 160 may convert the 128-stream second data data2 into 256-bit parallel data.

FIG. 8 is a sixth schematic structural diagram of a base die according to an embodiment of the present disclosure. In some other embodiments, referring to FIG. 8, the base die 100 is further configured to perform, in the writing phase, third ECC encoding processing on the first data data1 after the first error checking and correction processing, to generate third encoded data ecc3, where the second data data2 further includes the third encoded data ecc3; and perform, in the reading phase and before performing the second ECC encoding processing, a second error checking and correction processing on the second data data2, where the first data data1 after the first error checking and correction processing in the third data data3 is the first data data1 after the second error checking and correction processing.

In this way, the second data data2 not only includes the first data data1 after the first error checking and correction processing but also includes the third encoded data ecc3. Through the first error checking and correction processing, an error of the first data data1 and the first encoded data ecc1 during transmission from the processor to the base die 100 can be detected, and if the data has an error, the error can be corrected. Moreover, through the second error checking and correction processing, an error of the second data data2 during transmission between the base die 100 and the memory die are detected, and if the data has an error, the error can be corrected. It can be understood that, the transmission of the second data data2 between the base die 100 and the memory die includes: transmitting the second data data2 from the base die 100 to the memory die in the writing phase, and transmitting the second data data2 from the memory die to the base die 100 in the reading phase. In this way, an error of data transmitted on at least two transmission paths can be detected and corrected, which helps locate the specific path where the data transmission error occurs, and the at least two rounds of error checking and correction processing help improve the accuracy of data correction.

In addition, it should be understood that, the first ECC encoding processing and the third ECC encoding processing may be implemented by different encoding algorithms. For example, the first encoded data ecc1 may be 16-bit data, and the third encoded data ecc3 may be 32-bit data. Accordingly, the first error checking and correction processing and the second error checking and correction processing may be implemented by different decoding algorithms. That is, the first ECC encoding processing and the first error checking and correction processing are implemented by a first compiling algorithm, and the third ECC encoding processing and the second error checking and correction processing are implemented by a second compiling algorithm, where the first compiling algorithm may be different from the second compiling algorithm. The ECC error checking implemented by different compiling algorithms helps further improve the accuracy of data correction and makes it less difficult for the base die 100 to recognize different encoded data. In other embodiments, the first compiling algorithm may be the same as the second compiling algorithm.

Referring to FIG. 8, in addition to the first error checking and correction module 110 and the second encoding module 120, the base die 100 may further include: a third encoding module 111, configured to receive, in the writing phase, the first data data1 after the first error checking and correction processing, and perform the third ECC encoding processing to generate the third encoded data ecc3, where the second data data2 accordingly includes the first data data1 after the first error checking and correction processing and the third encoded data ecc3; and a second error checking and correction module 121, configured to receive, in the reading phase, the second data data2, and perform the second error checking and correction processing.

The third encoding module 111 is connected between the first error checking and correction module 110 and the memory die, and the second error checking and correction module 121 is connected between the memory die and the second encoding module 120. The second error checking and correction module 121 receives the first data data1 after the first error checking and correction processing and the third encoded data ecc3, and performs the second error checking and correction processing on the first data data1 after the first error checking and correction processing and the third encoded data ecc3.

The second error checking and correction module 121 helps detect whether data has an error during transmission from the memory die to the base die 100 in the reading phase, and corrects data that has an error, thereby further improving the capability of checking and correcting data error.

FIG. 9 is a seventh schematic structural diagram of a base die according to an embodiment of the present disclosure. Referring to FIG. 9, in some embodiments, the first error checking and correction module 110 may further generate a first error checking flag signal during the first error checking and correction processing. Further referring to FIG. 4 to FIG. 7 and FIG. 9, in some embodiments, the base die 100 may further include: a first memory cache module 101, configured to store the error of the first data data1 during transmission; and a first command module 102, configured to receive a first polling instruction PS1, and generate a first command signal CMD1 and a first clock signal CLK1. The first memory cache module 101 is further configured to output a first representation signal flag1 based on the first command signal CMD1 and the first clock signal CLK1, where the first representation signal flag1 represents the error of the first data data1 or the first encoded data ecc1 during transmission.

For the detailed description of the first memory cache module 101 and the first command module 102, reference may be made to the corresponding description of the foregoing embodiment, and details are not described herein again. Specifically, the first memory cache module 101 is connected to the first error checking and correction module 110.

Figure 10:
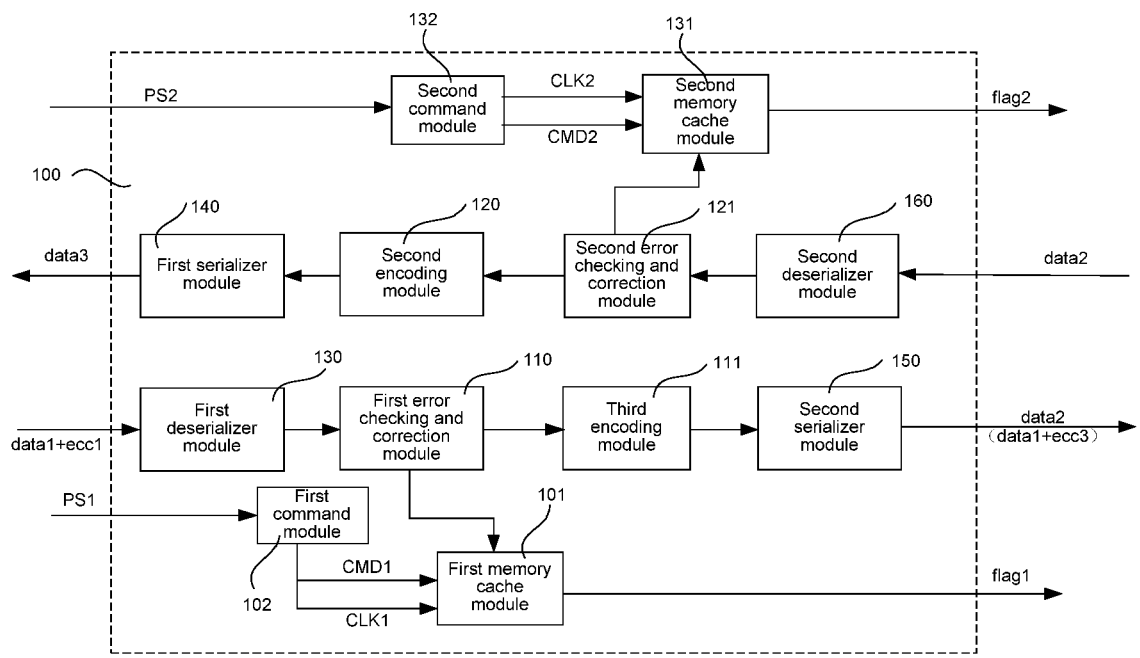
FIG. 10 is an eighth schematic structural diagram of a base die according to an embodiment of the present disclosure.

FIG. 10 is an eighth schematic structural diagram of a base die according to an embodiment of the present disclosure. Referring to FIG. 10, in some embodiments, the base die 100 may further include: a first deserializer module 130 and a first serializer module 140. For the detailed description of the first deserializer module 130 and the first serializer module 140, reference may be made to the foregoing description, and details are not described herein again. In addition, referring to FIG. 9, in some embodiments, the base die 100 may further include: a second serializer module 150 and a second deserializer module 160. The second serializer module 150 is connected between the third encoding module 111 and the memory die. In addition to performing the serialization processing on the first data data1 after the first error checking and correction processing, the second serializer module 150 further performs serialization processing on the third encoded data ecc3. The second deserializer module 160 is connected between the memory die and the second error checking and correction module 121. The second deserializer module 160 performs deserialization processing on the third encoded data ecc3 from the memory die and the first data data1 after the first error checking and correction processing.

For the detailed description of the first deserializer module 130, the first serializer module 140, the second deserializer module 160, and the second serializer module 150, reference may be made to the foregoing description, and details are not described herein again. It may be understood that, in some embodiments, the base die 100 includes a first deserializer module 130 and a first serializer module 140; in other embodiments, the base die 100 includes a first deserializer module 130, a first serializer module 140, a second serializer module 150, and a second deserializer module 160.

In some embodiments, the base die 100 is further configured to generate a second error checking flag signal during the second error checking and correction processing, and record, based on the second error checking flag signal, an error of the first data data1 after the first error checking and correction processing and the third encoded data ecc3 during transmission, that is, record the error of the second data data2 during transmission. Specifically, transmission paths of the second data data2 during transmission include: transmission from the third encoding module 111 to the memory die in the writing phase, and transmission from the memory die to the second error checking and correction module 121 in the reading phase.

Based on the second error checking flag signal, it is convenient to check the error of the first data data1 after the first error checking and correction processing and the third encoded data ecc3 during transmission.

Referring to FIG. 9 and FIG. 10, in some embodiments, the base die 100 may further include: a second memory cache module 131, configured to store the error of the first data data1 after the first error checking and correction processing and the third encoded data ecc3 during transmission; and a second command module 132, configured to receive a second polling instruction PS2, and generate a second command signal CMD2 and a second clock signal CLK2; and a second memory cache module 131, configured to output a second representation signal flag2 based on the second command signal CMD2 and the second clock signal CLK2, where the second representation signal flag2 represents the error of the first data data1 after the first error checking and correction processing and the third encoded data ecc3 during transmission.

Specifically, the second memory cache module 131 is connected to the second error checking and correction module 121.

For the detailed description of the second memory cache module, reference may be made to the description about the first memory cache module; for the detailed description of the second command module, reference may be made to the description about the first command module. Details are not described herein again.

The base die 100 provided in the foregoing embodiment not only has a data transmission function, but also has an ECC encoding processing function and an error checking and correction processing function. In this way, the die area of the base die 100 can be effectively used, to reduce the pressure on the die areas of the processor and the memory die and save the die areas of the processor and the memory die.

In addition, the base die 100 may further have data serialization processing and serialization processing functions, which helps reduce the number of transmission channels between the processor and the base die 100 and reduce the number of transmission channels between the memory die and the base die 100, thereby reducing the number of data transmission ports required by the processor, the base die 100, and the memory die, and saving die areas of the processor, the base die 100, and the memory die.

In addition, both the first error checking and correction module 110 and the second error checking and correction module 121 can detect and correct an error of data, which helps improve the capability of checking and correcting data error and locate a transmission path where a data error occurs.

Another embodiment of the present disclosure further provides a memory system, where the memory system includes a processor, a memory die, and the base die provided in the foregoing embodiment. The memory system provided by another embodiment of the present disclosure is described in detail below with reference to the drawings. It should be noted that, for the parts the same as or corresponding to those mentioned in the foregoing embodiment, reference may be made to the foregoing embodiment, and details will not be described herein again.

Figure 11:
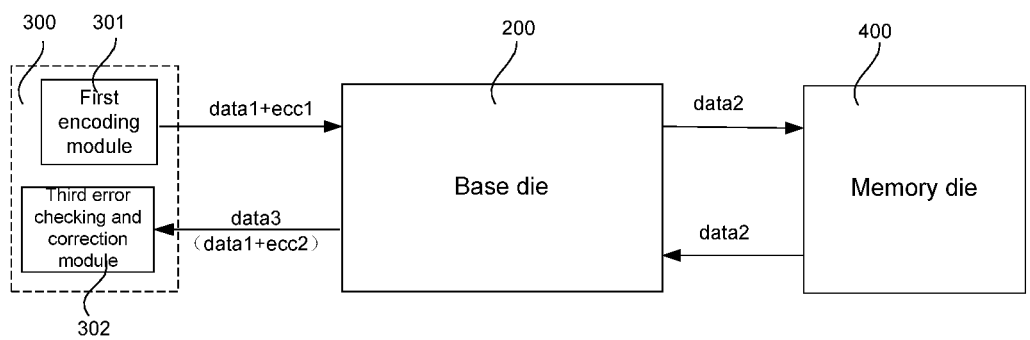
FIG. 11 is a first schematic structural diagram of a memory system according to an embodiment of the present disclosure.

FIG. 11 is a first schematic structural diagram of a memory system according to an embodiment of the present disclosure.

Referring to FIG. 11, the memory system includes: a base die 200, a processor 300, and a memory die 400. The processor 300 is configured to perform first ECC encoding processing on first data data1 in a writing phase to generate first encoded data ecc1, and transmit the first data data1 and the first encoded data ecc1 to the base die 200. The base die 200 is configured to receive the first data data1 in the writing phase, perform first error checking and correction processing on the first encoded data ecc1, and transmit second data data2 to the memory die 400 in the writing phase, where the second data data2 includes the first data data1 after the first error checking and correction processing. The base die 200 is further configured to receive the second data data2 from the memory die 400 in a reading phase, perform second ECC encoding processing to generate second encoded data ecc2, and transmit third data data3 to the processor 300 in the reading phase, where the third data data3 includes the second encoded data ecc2 and the first data data1 after the first error checking and correction processing. The memory die 400 is configured to receive the second data data2 from the base die 200 in the writing phase, store the second data data2, and transmit the second data data2 to the base die 200 in the reading phase. The processor 300 is further configured to receive the third data data3 from the memory die 200 in the reading phase, and perform third error checking and correction processing on the third data data3, to obtain the first data data1 after the third error checking and correction processing.

In the foregoing memory system, the ECC encoding processing and the error checking and correction processing on the data are implemented by the base die 200. Therefore, the memory die 400 does not need to perform the encoding processing and the error checking and correction processing, and the base die 200 can participate in the encoding processing and error checking and correction processing required by the processor 300, so that functions required by the processor 300 and the memory die 400 are reduced, which can make the die areas of the processor 300 and the memory die 400 less tight, thereby better improving the performance of the processor 300 and the memory die 400. For example, the reliability of the memory die 400 can be improved, thus enhancing the storage performance of the memory system.

In some embodiments, the memory system may be a DRAM memory system, for example, a double data rate (DDR) 4 DRAM memory system, or a DDR5 DRAM memory system. In other embodiments, the memory system may alternatively be a static random-access memory (SRAM) memory system, a NAND memory system, a NOR memory system, a FeRAM memory system, or a PcRAM memory system.

The processor 300 may include: a first encoding module 301, configured to perform the first ECC encoding processing on the first data data1 in the writing phase, to generate the first encoded data ecc1; and a third error checking and correction module 302, configured to receive the third data data3 in the reading phase and perform the third error checking and correction processing.

The base die 200 can provide a high-speed interface for data transmission in the memory system. In addition, the base die 200 is further configured to manage and control the memory die 400. In some embodiments, the base die 200 may be configured to perform temperature monitoring and temperature management on the memory die 400, and may further be configured to perform a Memory Build-In-Self Test (MBIST) on the memory die 400 and self-repair. In addition, the base die 200 is further configured to perform error checking and correction on transmitted data.

Figure 12:
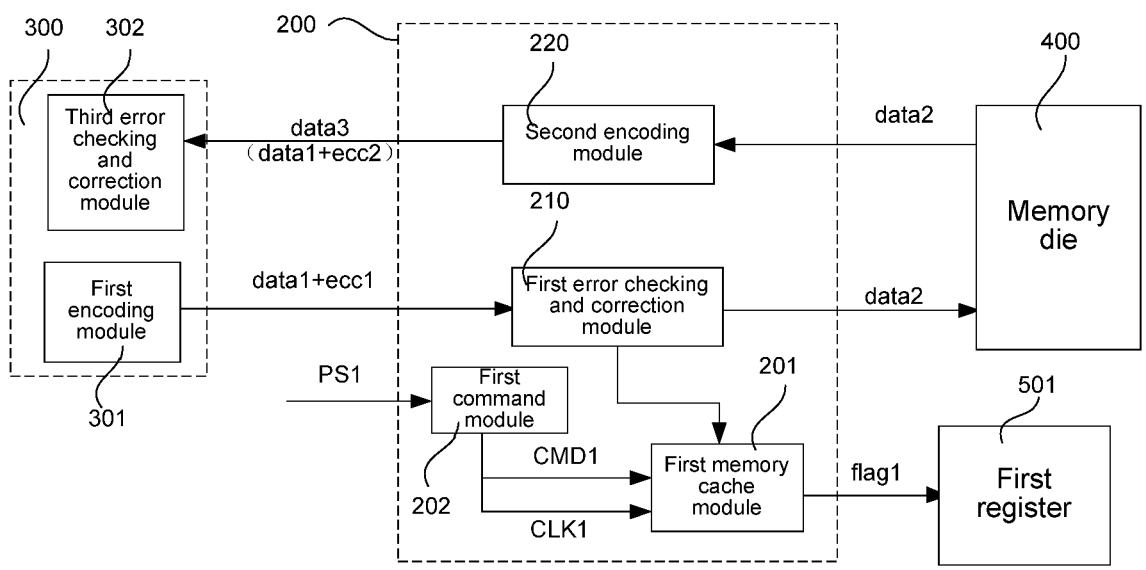
FIG. 12 is a second schematic structural diagram of a memory system according to an embodiment of the present disclosure.

FIG. 12 is a second schematic structural diagram of a memory system according to an embodiment of the present disclosure. Referring to FIG. 12, in some embodiments, the base die 200 may include: a first error checking and correction module 210, configured to receive the first data data1 in the writing phase and perform the first error checking and correction processing on the first encoded data ecc1; and a second encoding module 220, configured to receive, in the reading phase, the first data data1 after the first error checking and correction processing, and perform the second ECC encoding processing to generate the second encoded data ecc2.

Specifically, the first error checking and correction module 210 is connected between a data transmission port of the processor 300 and a data transmission port of the memory die 400; the second encoding module 220 is connected between the data transmission port of the processor 300 and the data transmission port of the memory die 400. The second data data2 does not include encoded data. Therefore, the memory die 400 may include a memory module configured to store the first data after the first error checking and correction processing. It is unnecessary design an encoding module for storing encoded data, which helps save the area of the memory die 400 and reduce the design difficulty of the memory die 400.

The working principle of the memory system shown in FIG. 12 is described below by using 256-bit first data data1 and 16-bit first encoded data ecc1 as an example.

In the writing phase, the processor 300 transmits the 256-bit first data data1 and the 16-bit first encoded data ecc1 to the first error checking and correction module 210; the first error checking and correction module 210 receives the 256-bit first data data1 and the 16-bit first encoded data ecc1 and performs the first error checking and correction processing, to output the 256-bit first data data1 after the first error checking and correction processing, where the 256-bit first data data1 after the first error checking and correction processing forms the second data data2. Specifically, if the 256-bit first data data1 has an error, the 256-bit first data data1 is transmitted to the memory die 400; if the 256-bit first data data1 has an error, error correction processing is performed on a bit where the error occurs, and the 256-bit first data data1 after the error correction processing is transmitted to the memory die 400.

In the reading phase, the memory die 400 transmits the second data data2 to the second encoding module 220; the second encoding module 220 performs the second ECC encoding processing to generate 16-bit second encoded data ecc2, and transmits the 256-bit first data data1 and the 16-bit second encoded data ecc2 to the processor 300.

In the foregoing solution, it is unnecessary to design a memory module configured to store encoded data in the memory die 400, which helps save the die area of the memory die 400. In addition, both the base die 200 and the processor 300 have the error checking and correction processing function, and the double error checking and correction processing helps improve the capability of checking and correcting data error.

Figure 13:
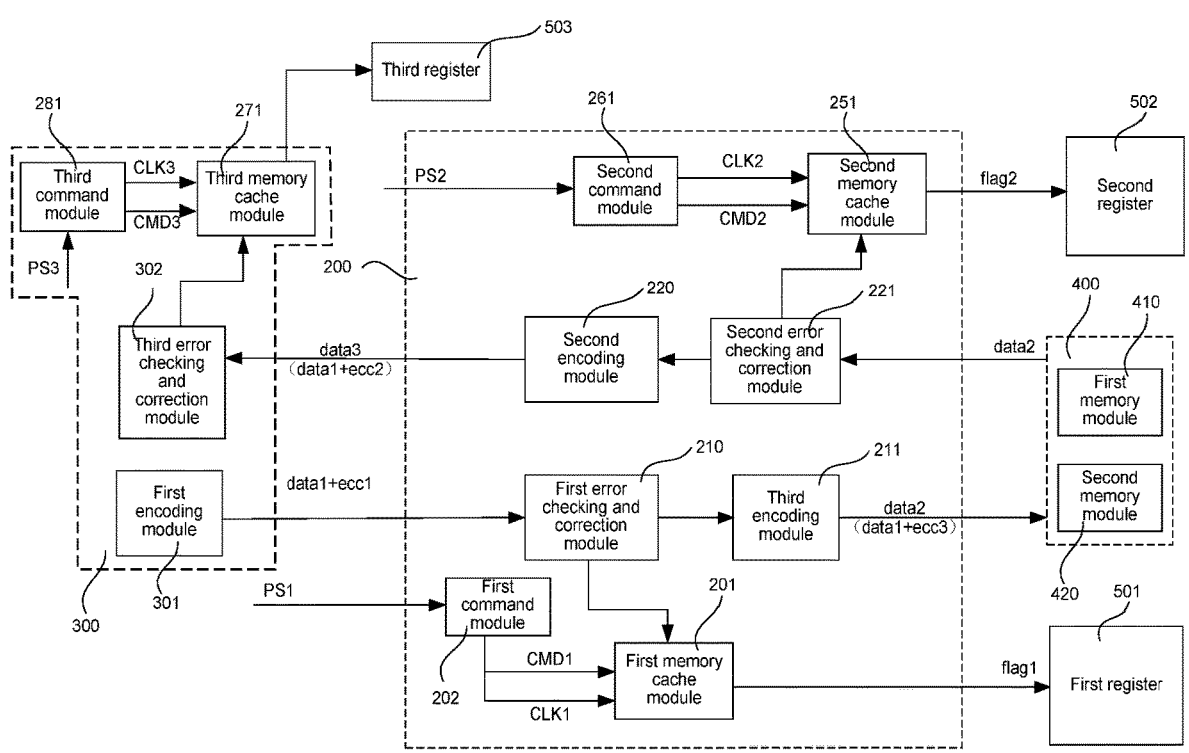
FIG. 13 is a third schematic structural diagram of a memory system according to an embodiment of the present disclosure.

FIG. 13 is a third schematic structural diagram of a memory system according to an embodiment of the present disclosure. Referring to FIG. 13, in some embodiments, the base die 200 may include the first error checking and correction module 210 and the second encoding module 220; apart from that, the base die 200 may be further configured to perform, in the writing phase, third ECC encoding processing on the first data data1 after the first error checking and correction processing, to generate the third encoded data ecc3, where the second data data2 further includes the third encoded data ecc3; and perform, in the reading phase and before performing the second ECC encoding processing, the second error checking and correction processing on the second data data2, where the first data data1 after the first error checking and correction processing in the third data data3 is the first data data1 after the second error checking and correction processing.

In this way, the second data data2 not only includes the first data after the first error checking and correction processing, but also includes the third encoded data ecc3. Accordingly, referring to FIG. 13, the memory die 400 includes: a first memory module 410, configured to store the first data data1 after the first error checking and correction processing; and a second memory module 420, configured to store the third encoded data ecc3.

Correspondingly, referring to FIG. 13, the base die 200 may further include: a third encoding module 211, configured to receive, in the writing phase, the first data data1 after the first error checking and correction processing, and perform the third ECC encoding processing, to generate the third encoded data ecc3; and a second error checking and correction module 221, configured to receive, in the reading phase, the second data data2, and perform the second error checking and correction processing.

In some embodiments, the first ECC encoding processing, the second ECC encoding processing, the first error checking and correction processing, and the third error checking and correction processing are implemented by a first compiling algorithm; the third ECC encoding processing and the second error checking and correction processing are implemented by a second compiling algorithm, and the first compiling algorithm is different from the second compiling algorithm. The error checking and correction performed on data with different compiling algorithms helps further improve the accuracy of data error checking and correction. Specifically, the third encoding module 211 and the first encoding module 301 may adopt different encoding algorithms; the third encoding module 211 and the second encoding module 220 may adopt different encoding algorithms; the first error checking and correction module 210 and the second error checking and correction module 221 may adopt different decoding algorithms.

Figure 14:
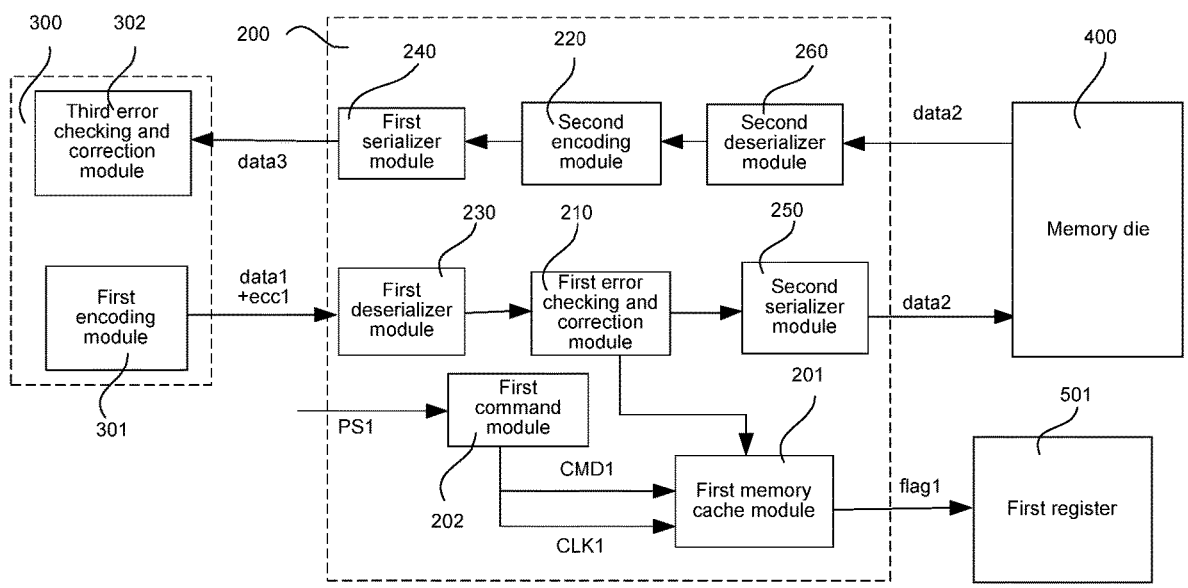
FIG. 14 is a fourth schematic structural diagram of a memory system according to an embodiment of the present disclosure.
Figure 15:
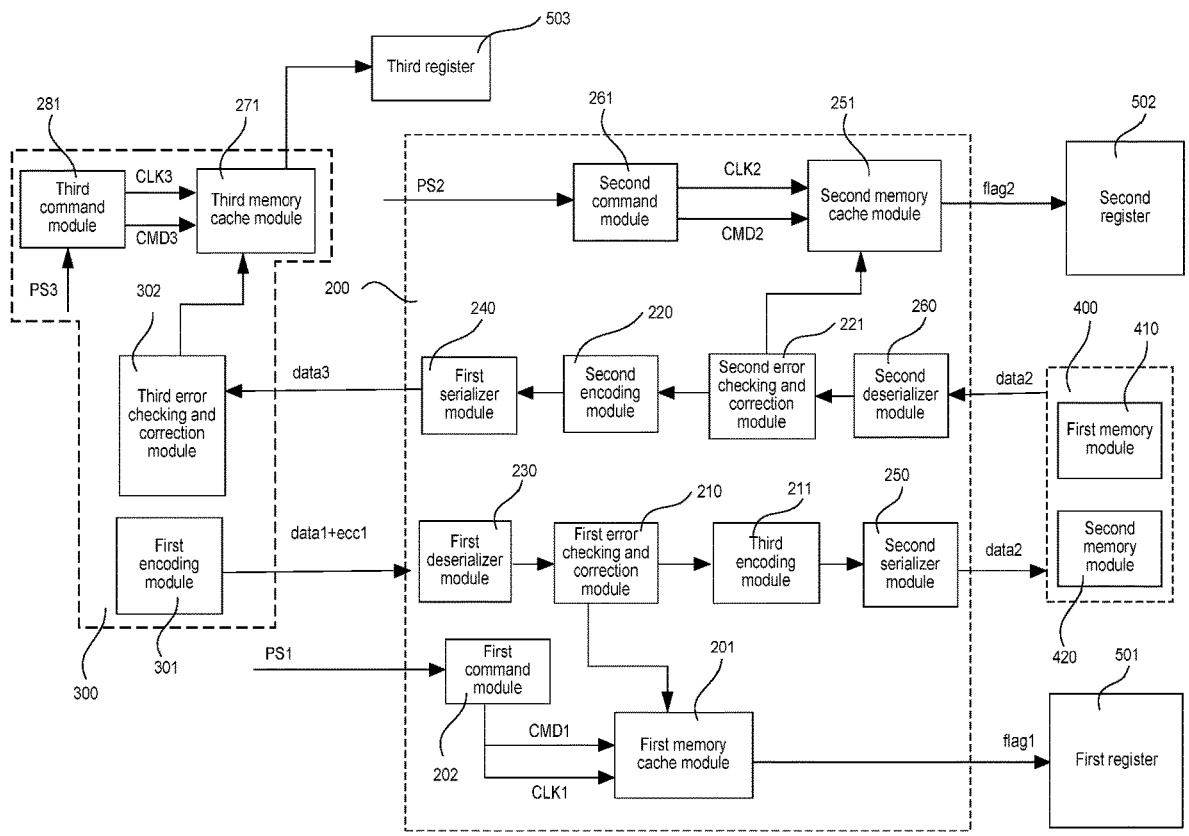
FIG. 15 is a fifth schematic structural diagram of a memory system according to an embodiment of the present disclosure.

FIG. 14 and FIG. 15 are fourth schematic structural diagrams of a memory system according to an embodiment of the present disclosure. Referring to FIG. 14 and FIG. 15, in some embodiments, the base die 200 may further include: a first deserializer module 230, configured to receive the first data data1 and the first encoded data ecc1 in the writing phase, perform first deserialization processing on the first data data1 and the first encoded data ecc1, and transmit the first data data1 and the first encoded data ecc1 after the first deserialization processing to the first error checking and correction module 210; and a first serializer module 240, configured to receive the third data data3 from the second encoding module 220 in the reading phase, perform first serialization processing on the third data data3, and transmit the third data data3 after the first serialization processing to the processor 300.

Specifically, the first deserializer module 230 is connected between the data transmission port of the processor 300 and a data transmission port of the first error checking and correction module 210, and the first serializer module 240 is connected between the data transmission port of the processor 300 and the data transmission port of the first error checking and correction module 210. In this way, the number of transmission channels between the processor 300 and the base die 200 can be less than the number of bits of the first data data1, thereby reducing the number of transmission channels between the processor 300 and the base die 200. This can reduce the number of data transmission ports required by the base die 200 and the processor 300 and helps reduce the complexity of the electrical connection structure between the processor 300 and the base die 200, thereby saving the die areas of the processor 300 and the base die 200. The working principle of the memory system shown in FIG. 14 is described below by using 256-bit first data data1 and 16-bit first encoded data as an example. It should be noted that, the first error checking and correction module 210 and the second encoding module 220 will not be described in detail again below.

In the writing phase, there may be 32+2 transmission channels between the processor 300 and the first error checking and correction module 210. The 256-bit first data data1 is transmitted through 32 transmission channels to the first deserializer module 230 for deserialization processing, and the 16-bit first encoded data ecc1 is transmitted through 2 transmission channels to the first deserializer module 230 for deserialization processing. The first deserializer module 230 outputs the 256-bit first data data1 and the 16-bit first encoded data ecc1 that are transmitted in parallel, where the first data data1 and the first encoded data ecc1 are transmitted to the first error checking and correction module 210 for first error checking and correction processing and then transmitted to the memory die 400. In the reading phase, 256-bit first data and the 16-bit second encoded data ecc2 that are outputted by the second encoding module 220 are transmitted to the first serializer module 240 for serialization processing. The 256-bit first data data1 after the serialization processing may be transmitted to the processor 300 through 32 transmission channels, and the 16-bit second encoded data ecc2 after the serialization processing may be transmitted to the processor 300 through 2 transmission channels.

It should be noted that, in other embodiments, the number of transmission channels between the processor 300 and the first error checking and correction module 210 may also be other appropriate values, for example, 128, 64 or 16.

Referring to FIG. 14 and FIG. 15, the base die 200 may further include: a second serializer module 250, configured to perform second serialization processing on the second data data2 in the writing phase, and transmit the second data data2 after the second serialization processing to the memory die 400; and a second deserializer module 260, configured to receive the second data data2 from the memory die 400 in the reading phase, perform second deserialization processing, and transmit the second data after the second deserialization processing to the second encoding module 220.

Referring to FIG. 14, in some examples, the second serializer module 250 is connected between the data transmission port of the first error checking and correction module 210 and the data transmission port of the memory die 400; the second deserializer module 260 is connected between the data transmission port of the memory die 400 and the data transmission port of the second encoding module 220. Referring to FIG. 15, in some examples, the second serializer module 250 is connected between the data transmission port of the memory die 400 and a data transmission port of the third encoding module 211; the second deserializer module 260 is connected between the data transmission port of the memory die 400 and the data transmission port of the second error checking and correction module 221.

In this way, the number of transmission channels between the memory die 400 and the base die 200 can be less than the number of bits of the first data data1, thereby reducing the number of transmission channels between the memory die 400 and the base die 200. This helps reduce the number of data transmission ports required by the base die 200 and the memory die 400 and helps reduce the complexity of the electrical connection structure between the memory die 400 and the base die 200, thereby saving the die areas of the memory die 400 and the base die 200.

It may be understood that, there are M data transmission channels between the processor 300 and the base die 200, and there are N data transmission channels between the base die 200 and the memory die 400, where M and N are both positive integers greater than 1. In some embodiments, the second data includes the first data after the first error checking and correction processing. By using 256-bit first data and 16-bit first encoded data as an example, M may be 32+2, where 32 of the data transmission channels are used for transmitting the first data, and 2 of the data transmission channels are used for transmitting the first encoded data; the first data after the first error checking and correction processing includes 256 bits, where N may be 32, 64 or 128, and N data transmission channels are used for transmitting the first data after the first error checking and correction processing.

In other embodiments, the second data not only includes the first data after the first error checking and correction processing, but also includes the third encoded data. By using 256-bit first data, 16-bit first encoded data, and 32-bit third encoded data as an example, M may be 32+2, and N may be 128+16. 32 of the M data transmission channels are used for transmitting the first data, 2 of the M data transmission channels are used for transmitting the first encoded data, 128 of the N data transmission channels are used for transmitting the first data after the first error checking and correction processing, and 6 of the N data transmission channels are used for transmitting the third data.

Referring to FIG. 12 to FIG. 15, in some embodiments, the base die 200 may further be configured to generate a first error checking flag signal during the first error checking and correction processing, and record an error of the first data data1 and the first encoded data ecc1 during transmission based on the first error checking flag signal; the memory system may further include: a first register 501, configured to store the error of the first data data1 and the first encoded data ecc1 during transmission.

Specifically, referring to FIG. 12 and FIG. 15, the base die 200 may include: a first memory cache module 201, configured to store the error of the first data data1 and the first encoded data ecc1 during transmission; and a first command module 202, configured to receive a first polling instruction PS1, and generate a first command signal CMD1 and a first clock signal CLK1. The first memory cache module 201 is further configured to output a first representation signal flag1 to the first register 500 based on the first command signal CMD1 and the first clock signal CLK1, where the first representation signal flag1 represents the error of the first data data1 and the first encoded data ecc1 during transmission.

In some embodiments, the processor 300 may further be configured to send the first polling instruction PS1 to the first command module 202, that is, the processor 300 performs polling regularly, to control the first memory cache module 201 to output the first representation signal flag1 to the first register 501. It may be understood that, in other embodiments, the first polling instruction may alternatively be provided by an external circuit.

Referring to FIG. 13 and FIG. 15, in some embodiments, the base die 200 may be further configured to generate a second error checking flag signal during the second error checking and correction processing, and record, based on the second error checking flag signal flag2, an error of the first data data1 after the first error checking and correction processing during transmission; the memory system may further include: a second register 502, configured to store the error of the first data data1 after the first error checking and correction processing during transmission.

Referring to FIG. 13 and FIG. 15, in some embodiments, the base die 200 may further include: a second memory cache module 251, configured to store the error of the first data data1 after the first error checking and correction processing during transmission; and a second command module 261, configured to receive a second polling instruction PS2, and generate a second command signal CMD2 and a second clock signal CLK2. The second memory cache module 251 is further configured to output a second representation signal flag2 to the second register 502 based on the second command signal CMD2 and the second clock signal CLK2, where the second representation signal flag2 represents the error of the first data data1 after the first error checking and correction processing during transmission.

Referring to FIG. 13 and FIG. 15, in some embodiments, the processor 300 may be further configured to generate a third error checking and correction flag signal during the third error checking and correction processing, and record, based on the third error checking and correction flag signal, an error of the first data data1 after the second error checking and correction processing during transmission; the memory system may further include: a third register 503, configured to store the error of the first data data1 after the second error checking and correction processing during transmission.

Referring to FIG. 13 and FIG. 15, in some embodiments, the processor 300 may further include: a third memory cache module 271, configured to store the error of the first data after the second error checking and correction processing during transmission; and a third command module 281, configured to receive a third polling instruction PS3, and generate a third command signal CMD3 and a third clock signal CLK3. The third memory cache module 271 is further configured to output a third representation signal flag3 to the third register 503 based on the third command signal CMD3 and the third clock signal CLK3, where the third representation signal flag3 represents the error of the first data data1 after the second error checking and correction processing during transmission.

It may be understood that, the first register 501, the second register 502, and the third register 503 may be the same register.

In the memory system provided by the foregoing embodiment, the base die 200 can implement the error checking and correction function. Accordingly, the memory die 400 does not need to have the error checking and correction function, and the base die 200 can assist in the error checking and correction function originally taken by the processor 300. Therefore, this helps save the space and areas of the processor 300 and the memory die 400, thereby improving the storage performance of the memory die 400 and enhancing the storage performance of the memory system.

In addition, the first error checking and correction module 210, the second error checking and correction module 221, and the third error checking and correction module 302 can detect and correct errors on different data transmission paths, which improves the error checking and correction capability of the memory system and helps locate a specific data transmission path where an error occurs.

Accordingly, an embodiment of the present disclosure further provides a semiconductor structure. The semiconductor structure may include the memory system provided by the foregoing embodiment. The semiconductor structure provided by the embodiment of the present disclosure is described in detail below with reference to the drawings. It should be noted that, for the parts the same as or corresponding to those mentioned in the foregoing embodiment, reference may be made to the foregoing embodiment, and details will not be described herein again.

Figure 16:
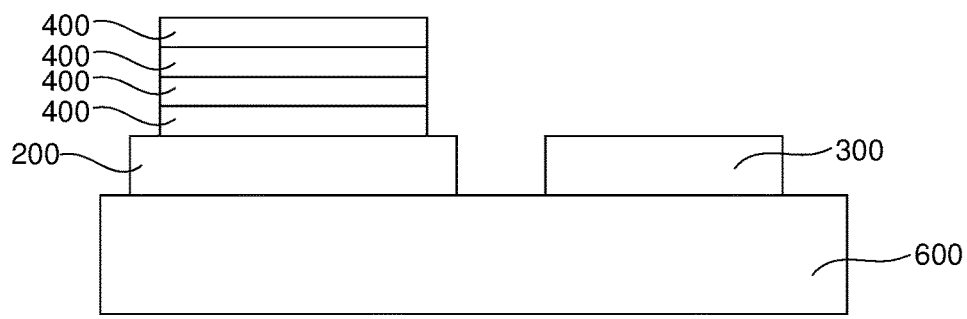
FIG. 16 is a cross-sectional schematic structural diagram of a semiconductor structure according to an embodiment of the present disclosure.

FIG. 16 is a cross-sectional schematic structural diagram of a semiconductor structure according to an embodiment of the present disclosure.

Referring to FIG. 16, the semiconductor structure includes: a carrier substrate 600; the memory system provided by the foregoing embodiment, where the processor 300 and the base die 200 are both located on a surface of the carrier substrate 600, and the memory die 400 is located on a surface of the base die 200 away from the carrier substrate 600.

The semiconductor structure may include a plurality of memory dies 400 stacked in sequence. The semiconductor structure may be a DRAM device, a SRAM device, or other memories.

In some embodiments, the carrier substrate 600 may be a printed circuit board (PCB). For the detailed description of the memory system, reference may be made to the foregoing embodiment, and details are not described herein again.

The semiconductor structure may be a 2.5-dimensional (2.5D) device. That is, the semiconductor structure is a stack structure, which helps reduce the size in a horizontal direction. In addition, the base die 200 in the semiconductor structure is used to implement the ECC error checking and correction function, thereby improving the performance of the semiconductor structure.

Those of ordinary skill in the art should understand that the above implementations are specific embodiments for implementing the present application. In practical applications, various changes may be made to the above implementations in terms of form and details without departing from the spirit and scope of the present application. Those skilled in the art may make changes and modifications to the implementations without departing from the spirit and scope of the present application. Therefore, the protection scope of the present application should be subject to the scope defined by the claims.

What is claimed is:

1. A base die, applied to a memory system, and comprising:
   a first error checking and correction module, configured to receive first data and first encoded data in a writing phase, and perform a first error checking and correction processing, wherein the first encoded data is obtained by performing a first error correction code encoding processing on the first data;
   a third encoding module, configured to receive, in the writing phase, the first data after the first error checking and correction processing, perform a third error correction code encoding processing on the first data after the first error checking and correction processing in the writing phase to generate third encoded data, and transmit second data to a memory die in the writing phase, wherein the second data comprises the first data after the first error checking and correction processing and the third encoded data;
   a second error checking and correction module, configured to receive the second data from the memory die in a reading phase, and perform a second error checking and correction processing on the second data in the reading phase; and
   a second encoding module, configured to perform a second error correction code encoding processing on the second data after the second error checking and correction processing to generate second encoded data, and transmit third data in the reading phase, wherein the third data comprises the second encoded data and the first data after the second error checking and correction processing.

2. The base die according to claim 1, further comprising:
   a first deserializer module, configured to receive the first data and the first encoded data in the writing phase, perform a first deserialization processing on the first data and the first encoded data, and transmit the first data and the first encoded data after the first deserialization processing to the first error checking and correction module; and
   a first serializer module, configured to receive the third data from the second encoding module in the reading phase, perform a first serialization processing on the third data, and transmit the third data after the first serialization processing to a processor.

3. The base die according to claim 2, further comprising:
   a second serializer module, configured to receive the second data in the writing phase, perform a second serialization processing, and transmit the second data after the second serialization processing to the memory die; and
   a second deserializer module, configured to receive the second data from the memory die in the reading phase, perform a second deserialization processing, and transmit the second data after the second deserialization processing to the second error checking and correction module.

4. The base die according to claim 1, further configured to generate a first error checking flag signal during the first error checking and correction processing, and record, based on the first error checking flag signal, an error of the first data and the first encoded data during a transmission to the base die.

5. The base die according to claim 4, further comprising:
   a first memory cache module, configured to store the error of the first data and the first encoded data during the transmission to the base die; and a first command module, configured to receive a first polling instruction, and generate a first command signal and a first clock signal;

wherein the first memory cache module is further configured to output a first representation signal based on the first command signal and the first clock signal, the first representation signal representing the error of the first data and the first encoded data during the transmission to the base die.

6. The base die according to claim 1, further configured to generate a second error checking flag signal during the second error checking and correction processing, and record, based on the second error checking flag signal, an error of the first data after the first error checking and correction processing and the third encoded data during a transmission from the base die to the memory die and then from the memory die to the base die.

7. The base die according to claim 6, further comprising:
a second memory cache module, configured to store the error of the first data after the first error checking and correction processing and the third encoded data during the transmission from the base die to the memory die and then from the memory die to the base die; and
a second command module, configured to receive a second polling instruction, and generate a second command signal and a second clock signal;
wherein the second memory cache module is further configured to output a second representation signal based on the second command signal and the second clock signal, the second representation signal representing the error of the first data after the first error checking and correction processing and the third encoded data during the transmission from the base die to the memory die and then from the memory die to the base die.

8. A memory system, comprising a processor, a base die, and a memory die, wherein
the processor comprises a first encoding module configured to perform a first error correction code encoding processing on first data in a writing phase to generate first encoded data, and transmit the first data and the first encoded data to the base die;
the base die comprises a first error checking and correction modules configured to receive the first data and the first encoded data in the writing phase, and perform a first error checking and correction processing; and a third encoding module configured to receive, in the writing phase, the first data after the first error checking and correction processing, perform a third error correction code encoding processing on the first data after the first error checking and correction processing in the writing phase to generate third encoded data, and transmit second data to the memory die in the writing phase, wherein the second data comprises the first data after the first error checking and correction processing and the third encoded data;
the base die further comprises a second error checking and correction module configured to receive the second data from the memory die in a reading phase, and perform a second error checking and correction processing on the second data in the reading phase;
and a second encoding module configured to perform a second error correction code encoding processing on the second data after the second error checking and correction processing to generate second encoded data, and transmit third data to the processor in the reading phase, wherein the third data comprises the second encoded data and the first data after the second error checking and correction processing;

the memory die is configured to receive the second data from the base die in the writing phase, store the second data, and transmit the second data to the base die in the reading phase, wherein the memory die comprises a first memory module configured to store the first data after the first error checking and correction processing, and a second memory module configured to store the third encoded data; and the processor further comprises a third error checking and correction module configured to receive the third data from the base die in the reading phase, and perform a third error checking and correction processing on the third data, to obtain the first data after the third error checking and correction processing.

9. The memory system according to claim 8, wherein
the first error correction code encoding processing, the second error correction code encoding processing, the first error checking and correction processing, and the third error checking and correction processing are implemented by a first compiling algorithm; the third error correction code encoding processing and the second error checking and correction processing are implemented by a second compiling algorithm; and the first compiling algorithm is different from the second compiling algorithm.

10. The memory system according to claim 8, wherein the base die further comprises:
a first deserializer module, configured to receive the first data and the first encoded data in the writing phase, perform a first deserialization processing on the first data and the first encoded data, and transmit the first data and the first encoded data after the first deserialization processing to the first error checking and correction module; and
a first serializer module, configured to receive the third data from the second encoding module in the reading phase, perform a first serialization processing on the third data, and transmit the third data after the first serialization processing to the processor.

11. The memory system according to claim 10, wherein the base die further comprises:
a second serializer module, configured to receive the second data in the writing phase, perform a second serialization processing, and transmit the second data after the second serialization processing to the memory die; and
a second deserializer module, configured to receive the second data from the memory die in the reading phase, perform a second deserialization processing, and transmit the second data after the second deserialization processing to the second error checking and correction module.

12. The memory system according to claim 8, wherein the base die is further configured to generate a first error checking flag signal during the first error checking and correction processing, and record, based on the first error checking flag signal, an error of the first data and the first encoded data during a transmission from the processor to the base die; and the memory system further comprises:
a first register, configured to store the error of the first data and the first encoded data during the transmission from the processor to the base die.

13. The memory system according to claim 8, wherein the base die is further configured to generate a second error checking flag signal during the second error checking and correction processing, and record, based on the second error checking flag signal, an error of the first data after the first error checking and correction processing during a transmission from the base die to the memory die and then from the memory die to the base die; and the memory system further comprises:

a second register, configured to store the error of the first data after the first error checking and correction processing during the transmission from the base die to the memory die and then from the memory die to the base die;

wherein the processor is further configured to generate a third error checking and correction flag signal during the third error checking and correction processing, and record, based on the third error checking and correction flag signal, an error of the first data after the second error checking and correction processing during a transmission from the base die to the processor; and the memory system further comprises:

a third register, configured to store the error of the first data after the second error checking and correction processing during the transmission from the base die to the processor.

14. A semiconductor structure, comprising:

a carrier substrate; and a memory system, comprising a processor, a base die, and a memory die, wherein the processor comprises a first encoding module configured to perform a first error correction code encoding processing on first data in a writing phase to generate first encoded data, and transmit the first data and the first encoded data to the base die;

the base die comprises a first error checking and correction module configured to receive the first data and the first encoded data in the writing phase, and perform a first error checking and correction processing; and a third encoding module configured to receive, in the writing phase, the first data after the first error checking and correction processing, perform a third error correction code encoding processing on the first data after the first error checking and correction processing in the writing phase to generate third encoded data, and transmit second data to the memory die in the writing phase, wherein the second data comprises the first data after the first error checking and correction processing and the third encoded data;

the base die further comprises a second error checking and correction module configured to receive the second data from the memory die in a reading phase, and perform a second error checking and correction processing on the second data in the reading phase;

and a second encoding module configured to perform a second error correction code encoding processing on the second data after the second error checking and correction processing to generate second encoded data, and transmit third data to the processor in the reading phase, wherein the third data comprises the second encoded data and the first data after the second error checking and correction processing;

the memory die is configured to receive the second data from the base die in the writing phase, store the second data, and transmit the second data to the base die in the reading phase, wherein the memory die comprises a first memory module configured to store the first data after the first error checking and correction processing, and a second memory module configured to store the third encoded data; and the processor further comprises a third error checking and correction module configured to receive the third data from the base die in the reading phase, and perform a third error checking and correction processing on the third data, to obtain the first data after the third error checking and correction processing;

wherein the processor and the base die are both located on a surface of the carrier substrate, and the memory die is located on a surface of the base die away from the carrier substrate.

* * * * *